(12) United States Patent
Kim

(10) Patent No.: US 6,281,136 B1
(45) Date of Patent: Aug. 28, 2001

(54) APPARATUS FOR ETCHING GLASS SUBSTRATE

(75) Inventor: Woong Kwon Kim, Anyang-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/645,331

(22) Filed: Aug. 25, 2000

Related U.S. Application Data

(62) Division of application No. 09/368,355, filed on Aug. 5, 1999, which is a continuation of application No. 08/883,501, filed on Jun. 26, 1997, now Pat. No. 6,071,374.

(30) Foreign Application Priority Data

Jun. 26, 1996 (KR) .............................................. 1996-23779

(51) Int. Cl.$^7$ ................................................. H01L 21/302
(52) U.S. Cl. .................................. 438/745; 216/97; 216/98
(58) Field of Search ..................................... 216/90, 92, 97, 216/98; 65/31; 156/345; 438/745

(56) References Cited

U.S. PATENT DOCUMENTS

| | | | |
|---|---|---|---|
| 3,023,139 | * 2/1962 | Van Tetterode ........................ | 216/90 |
| 3,266,963 | * 8/1966 | Stearns .................................. | 216/93 |
| 3,689,333 | 9/1972 | Hillhouse .............................. | 216/92 |
| 3,756,898 | 9/1973 | Frantzen et al. ..................... | 156/345 |
| 3,869,313 | 3/1975 | Jones et al. .......................... | 134/73 |
| 4,125,594 | 11/1978 | Su et al. ............................... | 423/488 |
| 4,147,581 | 4/1979 | Nelson ................................. | 156/345 |
| 4,240,880 | 12/1980 | Tsuchibuchi et al. ............... | 205/133 |
| 4,332,649 | 6/1982 | Salzle .................................... | 216/86 |
| 4,482,425 | 11/1984 | Battey .................................. | 156/637 |
| 4,501,636 | 2/1985 | Valley .................................. | 156/345 |
| 4,624,729 | 11/1986 | Bresciani et al. ................... | 156/345 |
| 4,715,686 | 12/1987 | Iwashita et al. .................. | 350/339 R |
| 4,746,185 | * 5/1988 | Shahidi-Hamedani ................ | 385/39 |
| 4,826,556 | 5/1989 | Kobayashi ........................... | 156/345 |
| 4,886,590 | 12/1989 | Tittle .................................... | 204/232 |
| 4,953,952 | 9/1990 | Okumura et al. .................... | 350/337 |
| 4,980,017 | 12/1990 | Kaji et al. ............................. | 216/93 |
| 5,000,795 | 3/1991 | Chung et al. ......................... | 134/37 |
| 5,002,627 | 3/1991 | Scheithauer et al. ............... | 156/345 |
| 5,082,518 | 1/1992 | Molinaro ............................. | 156/345 |
| 5,112,453 | 5/1992 | Behr et al. ........................... | 205/641 |
| 5,246,540 | 9/1993 | Soda ...................................... | 216/91 |
| 5,251,980 | 10/1993 | Hiraoka et al. ......................... | 374/7 |
| 5,378,308 | 1/1995 | Thoms .................................. | 216/92 |
| 5,389,148 | 2/1995 | Matsunaga .......................... | 118/300 |
| 5,540,784 | 7/1996 | Ranes ................................... | 134/10 |
| 5,543,181 | 8/1996 | Fehn et al. .......................... | 427/421 |
| 5,618,326 | * 4/1997 | Szebesta et al. ..................... | 65/388 |
| 5,654,057 | 8/1997 | Kitayama et al. .................. | 428/64.1 |
| 5,788,871 | 8/1998 | Huh ..................................... | 216/84 |
| 5,818,559 | 10/1998 | Yoshida .............................. | 349/122 |
| 5,819,434 | 10/1998 | Herchen et al. ...................... | 34/232 |
| 5,888,344 | 3/1999 | Ogami et al. ....................... | 156/345 |

FOREIGN PATENT DOCUMENTS

| | | |
|---|---|---|
| 1 920 009 | 10/1970 | (DE) . |
| 36 11 387 | 10/1987 | (DE) . |
| 38 53 904 | 10/1995 | (DE) . |
| 1 200 180 | 12/1959 | (FR) . |
| 829605 | 3/1960 | (GB) . |

* cited by examiner

*Primary Examiner*—Benjamin L. Utech
*Assistant Examiner*—Kin-Chan Chen
(74) *Attorney, Agent, or Firm*—Long Aldridge & Norman LLP

(57) ABSTRACT

An apparatus for etching a glass substrate includes a first bath containing an etchant, at least one porous panel having a plurality of jet holes in the first bath, the porous panel containing the etchant to jet the etchant against the glass substrate, a container storing the etchant, and a pump supplying the etchant from the container to the porous panel, the pump being connected to the container and the porous panel.

9 Claims, 4 Drawing Sheets

APPARATUS FOR ETCHING GLASS SUBSTRATE

This application is a DIV of Ser. No. 09/368,355 Aug. 5, 1999 which is a CON of Ser. No. 08/883,501 Jun. 26, 1997 U.S. Pat. No. 6,071,374

This application claims the benefit of Korean application No. 1996-23779 filed on Jun. 26, 1996, which is hereby incorporated by reference.

BACKGROUND OF THE INVENTION

1. Field of the Invention

The present invention relates to an etching apparatus, and more particularly, to an apparatus for etching glass substrate uniformly.

2. Discussion of the Related Art

CRT (cathode ray tube) display devices applicable to television or personal computers, for example, have large size screens. Since a luminous material-coated screen should be spaced apart a predetermined distance from an electron gun, there is a problem that the total volume of the display device becomes large. Thus, such CRTs cannot be applied to small size and low power consumption electronics such as a wall-mounted television, portable television, and notebook computers.

For small size and low power consumption, flat panel display devices such as LCD( Liquid Crystal Display), PDP(Plasma Display Panel), ELD(Electroluminescent Display), and VFD(Vacuum Fluorescent Display) have been introduced. In these flat panel display devices, the LCD has been most actively researched recently because of good picture quality and low power consumption in spite of various disadvantages. Although portable televisions and notebook computers having the LCD have been marketed, there are various problems yet to be solved. Because televisions and computers have become portable electronics, the reduction of the size and weight is one of the goals in the LCD research.

There are various methods to reduce the size and weight of the LCD. It is, however, difficult to reduce the number of the essential elements of the LCD. In addition, the weight and size of the essential elements are so small that the weight and size of the essential elements hardly can be reduced further. Fortunately, a glass substrate, which is one of the most basic element of the LCD, may be reduced in weight. Specially, the weight reduction of the glass substrate is very important because it makes up a large portion of the total weight of the LCD.

To reduce the weight of the glass substrate, the substrate has to be thinner. The glass processing is, however, very difficult technically because the processed thin glass can be easily damaged and the surface becomes rough after the process if it is not properly done.

Conventionally, the most useful method of reducing the weight of the glass substrate is to etch the surface of the glass substrate by soaking the substrate in a container having an etchant. In this method, however, the substrate is often not etched uniformly because of the non-uniform surface of the substrate. Further, the impurities generated during the etching process are attached to the surface of the substrate, so that the surface becomes even rougher.

To solve the aforementioned problems, the substrate is set up in the container having the etchant and then bubbles are generated to the surface of the substrate through a porous plate to remove the impurities attached on the surface of the substrate and a fresh etchant is applied to the surface of the substrate. In this method, however, since the bubbles having different sizes are applied on the upper portion and lower portion of the substrate, there is a thickness difference between the upper portion and lower portion. As a result, the substrate is still easily damaged even by light force during the LCD process because of the non-uniformity of the substrate. Further, the substrate has to be soaked for a long period, for example, scores of minutes, to etch the substrate sufficiently, Thus, the processing cost is increased in this method.

SUMMARY OF THE INVENTION

Accordingly, the present invention is directed to an apparatus for etching glass substrate that substantially obviates one or more of the problems due to limitations and disadvantages of the related art.

An object of the present invention is to provide an apparatus for etching glass substrate having a thin thickness and uniform surface.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other advantages and in accordance with the purpose of the present invention, as embodied and broadly described, the apparatus for etching the glass substrate includes an outer bath, an inner bath containing etchant within the outer bath, at least one porous panel having a plurality of jet holes mounted in the inner bath in a line to jet etchant against the glass substrate, a container for storing the etchant, and a pump connected to the container and the porous panel to supply the etchant in the container to the porous panel. The glass substrate is set up beside the porous panel.

In another aspect, the apparatus for etching a glass substrate includes a first bath containing an etchant, at least one porous panel having a plurality of jet holes in the first bath, the porous panel containing the etchant to jet the etchant against the glass substrate, a container storing the etchant, and a pump supplying the etchant from the container to the porous panel, the pump being connected to the container and the porous panel.

In another aspect, the apparatus for etching a glass substrate includes a first bath containing an etchant, at least a pair of porous panels having a plurality of jet holes in the first bath, the porous panels moving in a longitudinal direction of the glass substrate and jetting the etchant in the porous panel against the glass substrate, a container storing the etchant, and a pump supplying the etchant in the container to the porous panel, the pump being connected to the container and the porous panel.

In another aspect, the apparatus for etching a glass substrate includes a bath containing an etchant, and at least one porous panel mounted in the bath, the porous panel having a plurality of jet holes jetting the etchant against the glass substrate.

In a further aspect, the apparatus for etching a glass substrate includes a bath containing an etchant, and a plurality of porous panels in the bath, the porous panels having a plurality of jet holes jetting the etchant against the glass substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with this description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Figure 1:
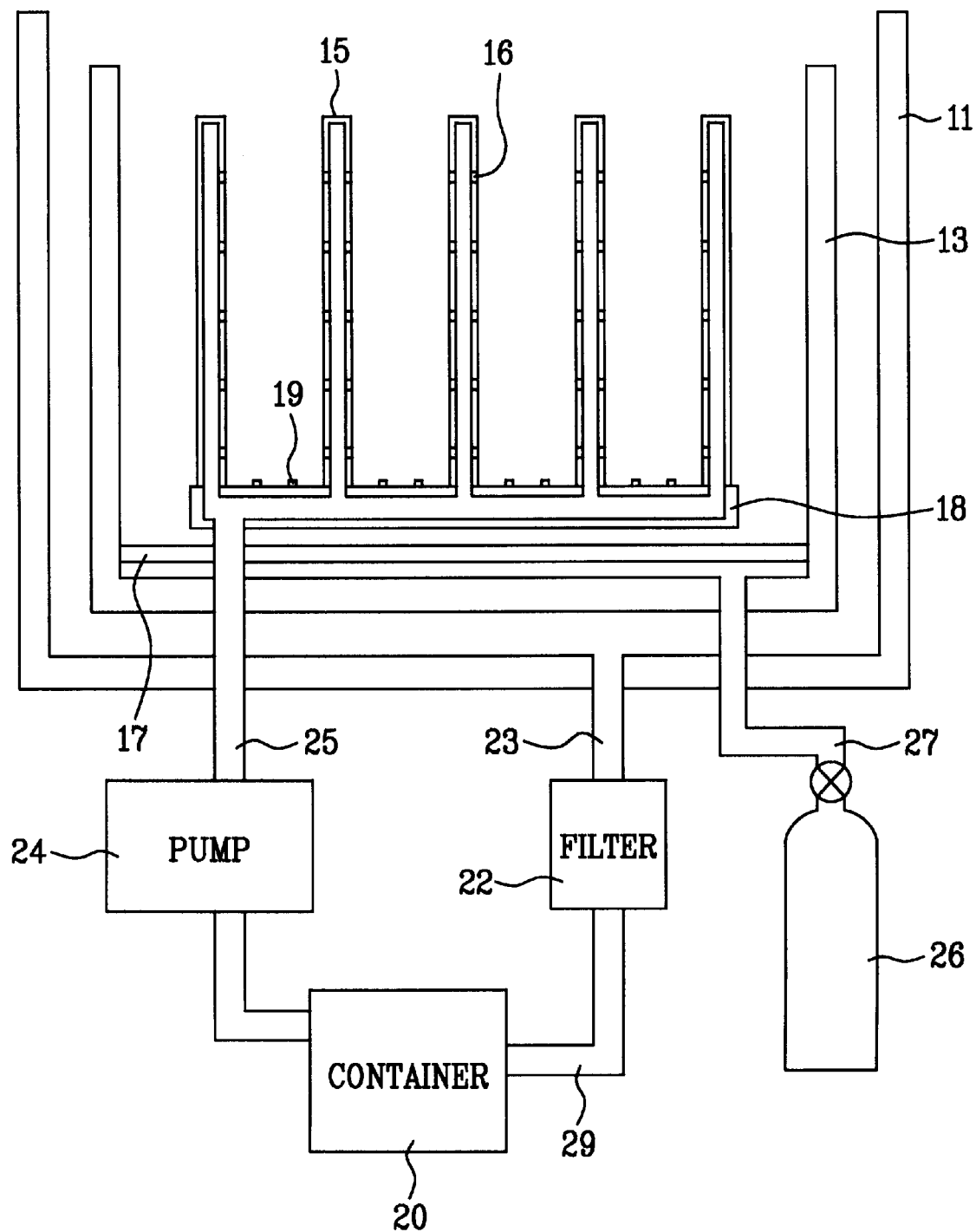
FIG. 1 is a schematic view of an etching apparatus according to a first embodiment of the present invention.
Figure 2:
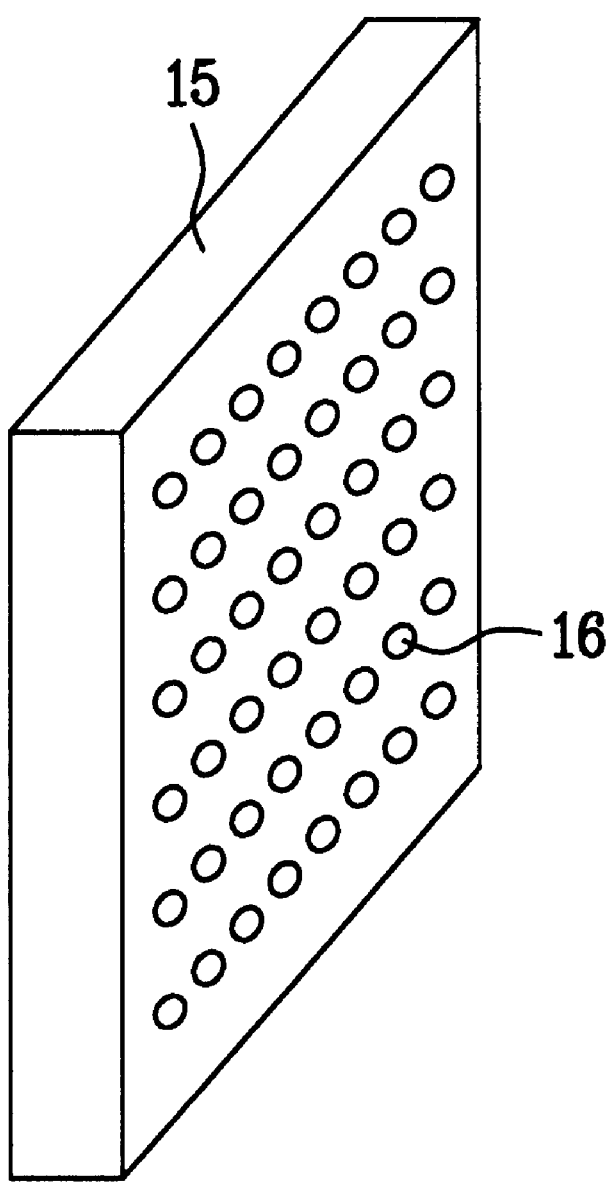
FIG. 2 illustrates a porous panel of the first embodiment.

Referring the FIG. 1, an inner bath 13 is mounted within an outer bath 11. A height of the inner bath 13 containing an etchant is lower than that of the outer bath 11, so that the etchant passing over the inner bath 13 is collected in the bottom of the outer bath 11. In the inner bath 13, an establishment stand 18 is mounted. A plurality of porous panels 15 are attached on the establishment stand 18 and the glass substrates are positioned between the porous panels 15. As shown in FIG. 2, a plurality of jet holes 16 are formed on the porous panel 15 in the vertical and horizontal directions to jet the etchant in the porous panels 15 into glass substrates 30 (shown in FIG. 3). Between the porous panels 15 on the establishment stand 18, a pair of projections 19 to hold the glass substrate are formed.

The outer bath 11 is connected to a filter 22 and a pipe 23. The etchant passed over the inner bath 13 is thus collected in the bottom of the outer bath 11 and flows into the filter 22 through the pipe 23 for filtering the collected etchant. The filtered etchant flows into the storage container 20 through the pipe 29. A pump 24 is connected to the storage container 20 to supply the etchant to the inner space of the establishment stand 18 through the supplying pipe 25.

A porous plate 17 having a plurality of holes is mounted on the lower portion of the inner bath 13 and generates the bubbles by the gas supplied from a gas tank 26 through a gas supplying pipe 27. The bubbles flow up along the glass substrates 30 to remove the impurities generated and attached on the surface of the substrates during the etching process.

Figure 3:
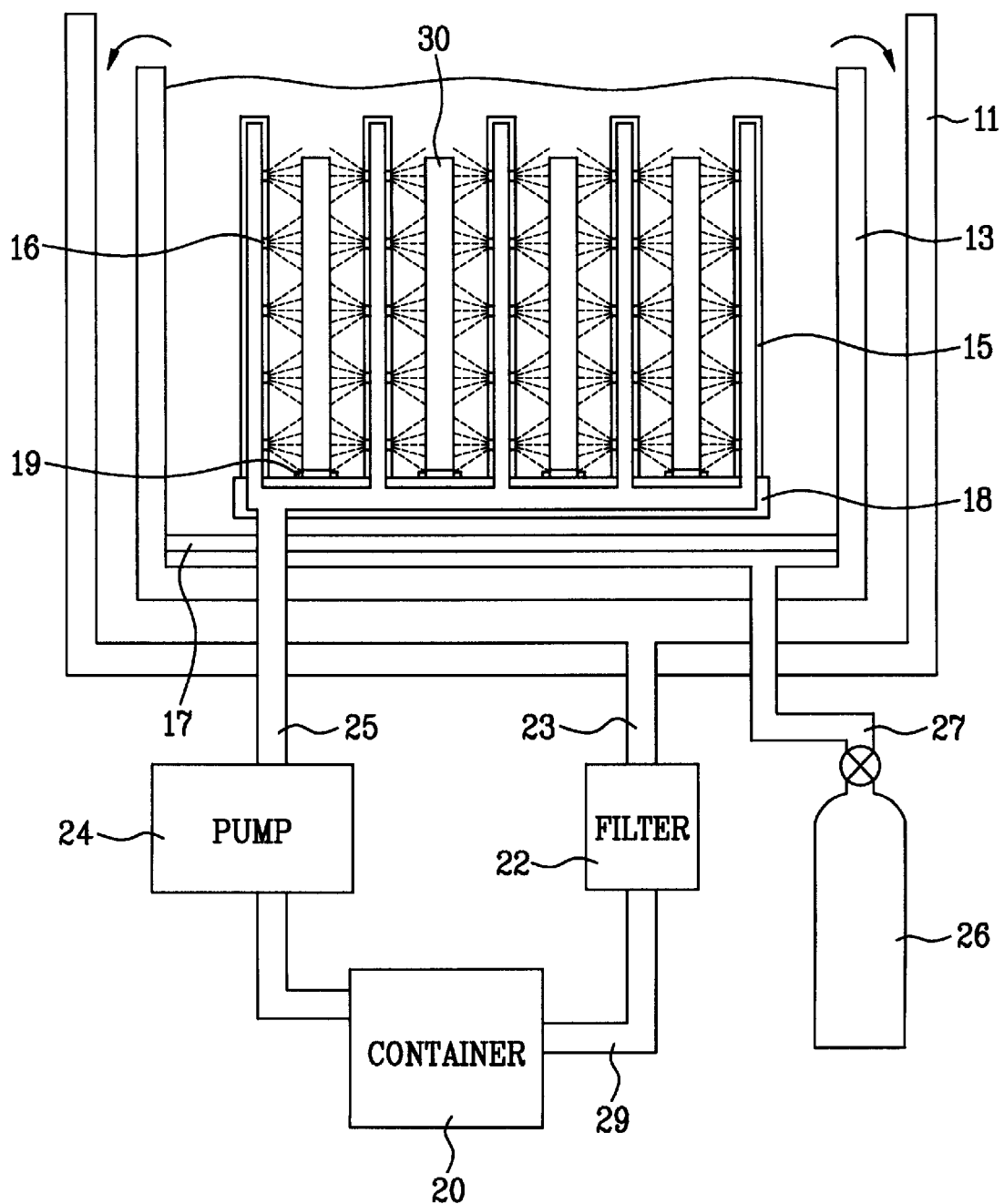
FIG. 3 is a schematic view to explain an operation of the etching apparatus of the first embodiment.

As shown in FIG. 3, the glass substrates 30 are fixed by at least a pair of the establishment projections 19 formed on the establishment stand 18 and arranged between the porous panels 15. When the pump 24 is operating, the etchant is jetting into the glass substrate 30 through the jet holes 16 by the pressure of the pump 24. The inner spaces of the porous panels 15 and the establishment stand 18 containing the etchant are interconnected with each other. The inner bath 13 also contains the etchant. When the etchant in the storage container 20 is supplied to the establishment stand 18 through the etchant supplying pipe 25 by the operation of the pump 24, the pressure of the pump 24 is transmitted to the etchant in the porous panels 15 connected to the establishment stand 18. The etchant is thus jetting into the both sides of the glass substrates 30 through the jet holes 16. As a result, the both sides of the glass substrates 30 are etched. At that time, the porous panels 15 having a larger area than that of the glass substrates 30 are used for uniform etching of the total area of the substrates 30. Further, the outside of the porous panels 15 mounted on the outermost of the establishment stand 18 (not facing to the glass substrate) does not have the jet holes 16. Although the etchant in the inner bath 13 etches the glass substrates 30, the most effective etching is caused by the fresh etchant jetted through the jet holes 16 (i.e., the clean etchant filtered by the filter 22). A plurality of the jet holes 16 are formed in the porous panels 15 in the vertical and horizontal directions at an appropriate interval to jet the etchant into the glass substrates 30 uniformly.

During the etching process, the etchant in the inner bath 13 includes impurities generated from the reaction between the substrate 30 and the etchant. After the etchant is continuously supplied to the inner bath 13 by the pump 24, the etchant flows over the inner bath 13 and is then collected in the bottom of the outer bath 11. The collected etchant flows into the filter 22 through the pipe 23 to remove the impurities from the etchant and then stored in the storage container 20 through the pipe 29.

The bubbles generated from the porous plate 17 remove the impurities attached on the surface of the glass substrates 30 by passing over the surface of the glass substrates 30.

Although the porous panels 15 are mounted on the establishment stand 18 and the etchant stored in the storage container 20 is supplied to the porous panels 15 through the establishment stand 18 in the first embodiment, the pump 24 can be directly connected to a plurality of the porous panels 15 to supply the etchant. Further, the etchant including the impurities can be filtered by a separative process and then stored in the storage container 20. In addition, it is possible to have only one porous panel mounted on the establishment stand and one glass substrate positioned next to the porous panel. Thus, only one side of the substrate facing to the porous panel may be etched.

Figure 4:
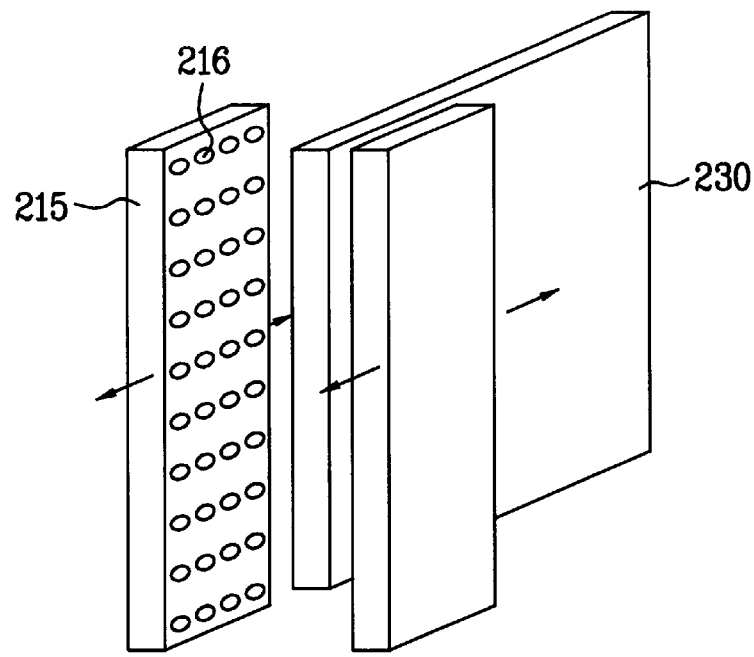
FIG. 4 is a schematic view showing an operation of an etching apparatus according to a second embodiment of the present invention.

FIG. 4 is a schematic view of a second embodiment of the present invention. FIG. 4 illustrates only a glass substrate 230 and porous panels 215. The other elements of the second embodiment are the same as the first embodiment except for the shape of the porous panel 215 and the operation of the apparatus. Accordingly, the general description of the structure and operation is omitted and only distinguished characteristics of the second embodiment is described as follows.

The porous panels 215 have a plurality of jet holes 216 in the vertical and horizontal directions. A width of the porous panels 215 of the second embodiment is smaller than that of the first embodiment. Thus, the width of the porous panels 215 is smaller than that of the glass substrate 230 positioned between the porous panels 215. Further, the number of the jet holes 16 the second embodiment is much smaller than that of the first embodiment. A motor (not shown in FIG. 4) is connected to the porous panels 215, and the panels 215 move back and forth in the longitudinal direction of the glass substrate 230.

When the pump 24 (shown in FIG. 3) is operated to supply the etchant, that is, the pump 24 applies the pressure into the etchant in the porous panels 15, the motor is simultaneously operated so that the porous panels 15 move back and forth in the longitudinal direction of the glass substrate 230. While the porous panels 215 are moving, the porous panels 215 are jetting the etchant to etch the glass substrate 230 through the jet holes 216. A plurality of the porous panels 215 arranged in lines are simultaneously moved by the motor.

Figure 5:
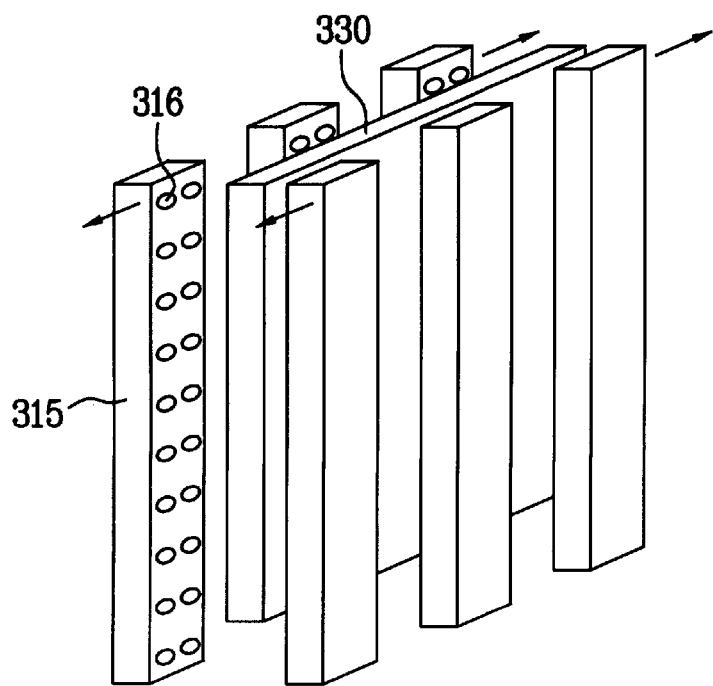
FIG. 5 is a schematic view showing an operation of an etching apparatus according a third embodiment of the present invention.

FIG. 5 is a schematic view of a third embodiment of the present invention. In this embodiment, a plurality of narrow porous panels 315 are formed in the longitudinal direction of the glass substrate 330. The narrow porous panels 315 are mounted on the establishment stand 18 (shown in FIG. 3) and moved simultaneously by a motor (not shown in FIG. 5). When the etchant is supplied to the porous panels 315 from the storage container 20 (shown in FIG. 3) by the pump 24, the porous panels 315, moving back and forth in the longitudinal direction of the glass substrate 30, are jetting the etchant to etch the glass substrate 330 through the jet holes 316. Thus, the etching speed is much improved.

Alternatively, in the second and third embodiments, the panels may be fixed and the substrate 330 may be moved back and forth in the longitudinal direction of the substrate.

In the aforementioned etching apparatus, since a glass substrate is uniformly etched by an etchant jetted through the jet holes of the porous panels, a glass substrate is readily processed to have a thin thickness and flat surface.

It will be apparent to those skilled in the art that various modifications and variations can be made in the apparatus for etching glass substrate of the present invention without departing from the spirit or scope of the invention. Thus, it is intended that the present invention cover the modifications and variations of this invention provided they come within the scope of the appended claims and their equivalents.

What is claimed is:

1. A method for etching a glass substrate, the method comprising the steps of:
   providing a first bath including at least two porous panels having a plurality of jet holes;
   placing a glass substrate between the porous panels in the first bath; and
   directing a pressurized flow of etchant through the plurality of jet holes at the glass substrate.

2. The method of claim 1, further comprising the step of:
   releasing gas bubbles in the first bath at a location beneath the glass substrate.

3. The method of claim 2, further comprising the step of collecting etchant that overflows the first bath in a second bath.

4. The method of claim 3, further comprising the step of filtering etchant collected in the collecting step.

5. The method of claim 4, further comprising the step of using etchant filtered in the filtering step during at least part of the directing step.

6. The method of claim 1, further comprising the step of moving the glass substrate relative to the pressurized flow of etchant.

7. The method of claim 1, further comprising the step of moving the pressurized flow of etchant relative to the glass substrate.

8. The method of claim 1, further comprising the step of moving the glass substrate relative to the porous panels during the step of directing a pressurized flow of etchant through the jet holes at the glass substrate.

9. The method of claim 1, further comprising the step of moving the porous panels relative to the glass substrate during the step of directing a pressurized flow of etchant through the jet holes at the glass substrate.

\* \* \* \* \*